(12) United States Patent
Doherty et al.

(10) Patent No.: US 6,998,918 B2
(45) Date of Patent: Feb. 14, 2006

(54) AUTOMATIC CURRENT REDUCTION BIASING TECHNIQUE FOR RF AMPLIFIER

(75) Inventors: Mark Doherty, Westford, MA (US); Anthony Quaglietta, North Andover, MA (US); Greg Yuen, Harlow (GB)

(73) Assignee: SiGe Semiconductor (U.S.), Corp., Methuen, MA (US)

( * ) Notice: Subject to any disclaimer, the term of this patent is extended or adjusted under 35 U.S.C. 154(b) by 138 days.

(21) Appl. No.: 10/819,921

(22) Filed: Apr. 8, 2004

(65) Prior Publication Data

US 2005/0225394 A1    Oct. 13, 2005

(51) Int. Cl.
    H03G 3/10    (2006.01)
(52) U.S. Cl. .................................. 330/285; 330/296
(58) Field of Classification Search ................ 330/285, 330/296, 295, 124 R, 310, 302
    See application file for complete search history.

(56) References Cited

U.S. PATENT DOCUMENTS

| | | |
|---|---|---|
| 3,925,718 A | 12/1975 | Wittlinger |
| 5,825,228 A | 10/1998 | Gross |
| 6,396,347 B1 * | 5/2002 | Lie et al. ..................... 330/285 |
| 6,472,857 B1 | 10/2002 | Genest et al. |
| 6,946,913 B1 * | 9/2005 | Moriwaki et al. .......... 330/296 |
| 2002/0113655 A1 | 8/2002 | Lautzenhise et al. |

FOREIGN PATENT DOCUMENTS

| | | |
|---|---|---|
| WO | WO 2004/027984 A1 | 4/2004 |
| WO | WO 2004/055972 A1 | 7/2004 |
| WO | WO 2004/055973 A1 | 7/2004 |

* cited by examiner

*Primary Examiner*—Henry Choe
(74) *Attorney, Agent, or Firm*—Kenyon & Kenyon

(57) ABSTRACT

A power amplifier (PA) circuit is disclosed that comprises a PA output stage having a first amplifying portion having a first gain portion and disposed in parallel with a second amplifying portion having a second gain portion, the PA output stage having an output stage gain, an input port for receiving of a RF input signal. A second RF power detector is provided for detecting a signal power of the RF input signal and for providing a second detected signal. An at least a biasing circuit is provided for biasing the first amplifying portion and the second amplifying portion in dependence upon the second detected signal for amplifying the RF input signal such that for the output stage gain the ratio between the first gain portion and the second gain portion varies in dependence upon the second detected signal.

27 Claims, 3 Drawing Sheets

AUTOMATIC CURRENT REDUCTION BIASING TECHNIQUE FOR RF AMPLIFIER

FIELD OF THE INVENTION

The invention relates to the field of RF power amplifier circuits and more specifically to the field of quiescent current reduction for RF power amplifier circuits.

BACKGROUND OF THE INVENTION

Many people desire a longer operating lifetime for their battery-powered electronic, such as mobile telephones, MP3 players, and so forth. Typically in order for these battery-powered devices to conserve electrical power, their current consumption is managed preferably retaining operating characteristics thereof unaltered over as much of the battery operating parameters as possible. For example, many electrical devices operate in two well-known modes of operation—standby mode and operating mode. In the standby mode, minimal circuitry is enabled for reducing power consumption relative to the operating mode, where a majority of the circuitry is energized and the electrical device operates in accordance with its design parameters. Unfortunately, though this typical methodology is helpful, there is still a need to further conserve power.

Many of these battery operated electrical devices utilize power amplifier (PA) circuitry in order to amplify signals, such as for example RF signals. A very common PA output stage is an emitter follower circuit. Unfortunately, class A emitter follower stages typically have large quiescent currents resulting in significant power consumption regardless of input signal power and use. Thus, it is often these very PAs that are disabled in standby mode. Unfortunately, these PAs consume power due to the quiescent current whenever they are in the operating mode.

Ultimately, the quiescent current for a PA circuit for a given application is determined based on the amplification provided and the physical properties of the PA. Reducing the bias on a PA typically lessens the quiescent current and as such, reduces the overall power consumption. Of course, it also reduces the overall amplification. PAs are typically biased controlled in a "digital" or "analog" manner. In the digital control methodology switching of an effective bias voltage or current between discrete states is performed. In accordance with the analog methodology, a bias voltage is continuously varied using a voltage controlled biasing voltage or a voltage controlled current source. Since it would be advantageous to reduce quiescent current in order to reduce power consumption, this has been attempted and described in U.S. Pat. No. 5,825,228 which provides a low quiescent power, high output power rail-to rail amplifier output stage and U.S. Pat. No. 6,472,857 provide a very low quiescent current regulator circuit.

The challenge in using the prior art circuits arises when these circuits are used in current sensitive devices, such as those that are battery powered. One approach is to switch between different operational amplifier circuits each having a different topology and thereby switch between different amplification/quiescent current pairings. Although it has been readily demonstrated that implementing of a switching PA circuit is possible on an IC, it is an involved process to implement the actual control circuitry for controlling of the switching point for the PA. Such control circuitry for controlling of the switching requires a feedback loop with a form of calibration and detection algorithm along with external sensors and extensive considerations for handling hysteresis around the bias switching points. In addition, natural gain enhancements that occur with increasing bias level cause additional challenges for calibration approaches. This further complicates these devices because of the addition of more calibration points and results in increased testing time for assembled products. In practice, it is difficult to apply this switching technique because of changes in phase and gain when the RF path is switched cannot be tolerated by a baseband processor without data or call drops.

It is therefore an object of the invention to provide a mechanism for automatic control of quiescent current in PA circuits without employing the use of switching circuitry.

SUMMARY OF THE INVENTION

In accordance with the invention there is provided a power amplifier (PA) comprising: a PA output stage having a first amplifying portion having a first gain portion and disposed in parallel with a second amplifying portion having a second gain portion, the PA output stage having an output stage input port for receiving of a RF input signal, an output stage output port for providing of an amplified RF signal, and an output stage gain being the gain from the output stage input port to the output stage output port; a second RF power detector for detecting a signal power of the RF input signal and for providing a second detected signal based on the detected signal power; and, at least a biasing circuit for biasing the first amplifying portion and the second amplifying portion in dependence upon the second detected signal for amplifying the RF input signal such that for a same output stage gain the ratio between the first gain portion and the second gain portion varies in dependence upon the second detected signal.

In accordance with the invention there is provided a method of controlling of quiescent current for a radio frequency (RF) power amplifier (PA) circuit comprising: providing a PA output stage having an output stage gain, an input port and an output port for providing an amplified RF signal therefrom; providing of a RF input signal having a RF input signal power and a modulation frequency to the PA output stage input port; detecting the RF input signal power that is provided to the PA output stage input port to form a second detected signal; amplifying the RF input signal using a first amplifying portion of the PA output stage having a first gain portion disposed in parallel with a second amplifying portion of the PA output stage, which is different from the first amplifying portion, the second amplifying portion having a second gain portion for forming the amplified RF signal in dependence upon the first and the second gain portions; and, controlling at least one of the first gain portion and the second gain portion of the PA output stage in dependence upon the second detected signal in a manner that for higher RF input signal powers the second gain portion is lower than the first gain portion, a ratio between the first gain portion and the second gain portion varying based on the variations in the RF input signal power such that for lower RF input signal powers the second gain portion forms a greater proportion of the output stage gain than for higher RF input signal powers.

In accordance with the invention there is provided a power amplifier circuit comprising: an output amplification stage for receiving one of the RF input signal having a modulation frequency and an amplified version of the RF input signal having a modulation frequency and for providing the amplified RF signal from an output port thereof with the amplified RF signal based upon the RF input signal, the output amplification stage comprising: a second amplification stage; a third amplification stage capacitively coupled with the second amplification stage, the second and third amplification stages having input ports thereof coupled together and output ports thereof coupled together; a second RF power detector circuit coupled with the output amplification stage for detecting a signal power of one of the RF input signal and the amplified version of the RF input signal and for generating a second detected signal; a second biasing circuit for biasing of the second amplification stage independently of the second detected signal; and, a third biasing circuit, different from the second biasing circuit, for biasing of the third amplification stage and for adjusting the third gain at least partially in dependence upon the second detected signal.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

Figure 1:
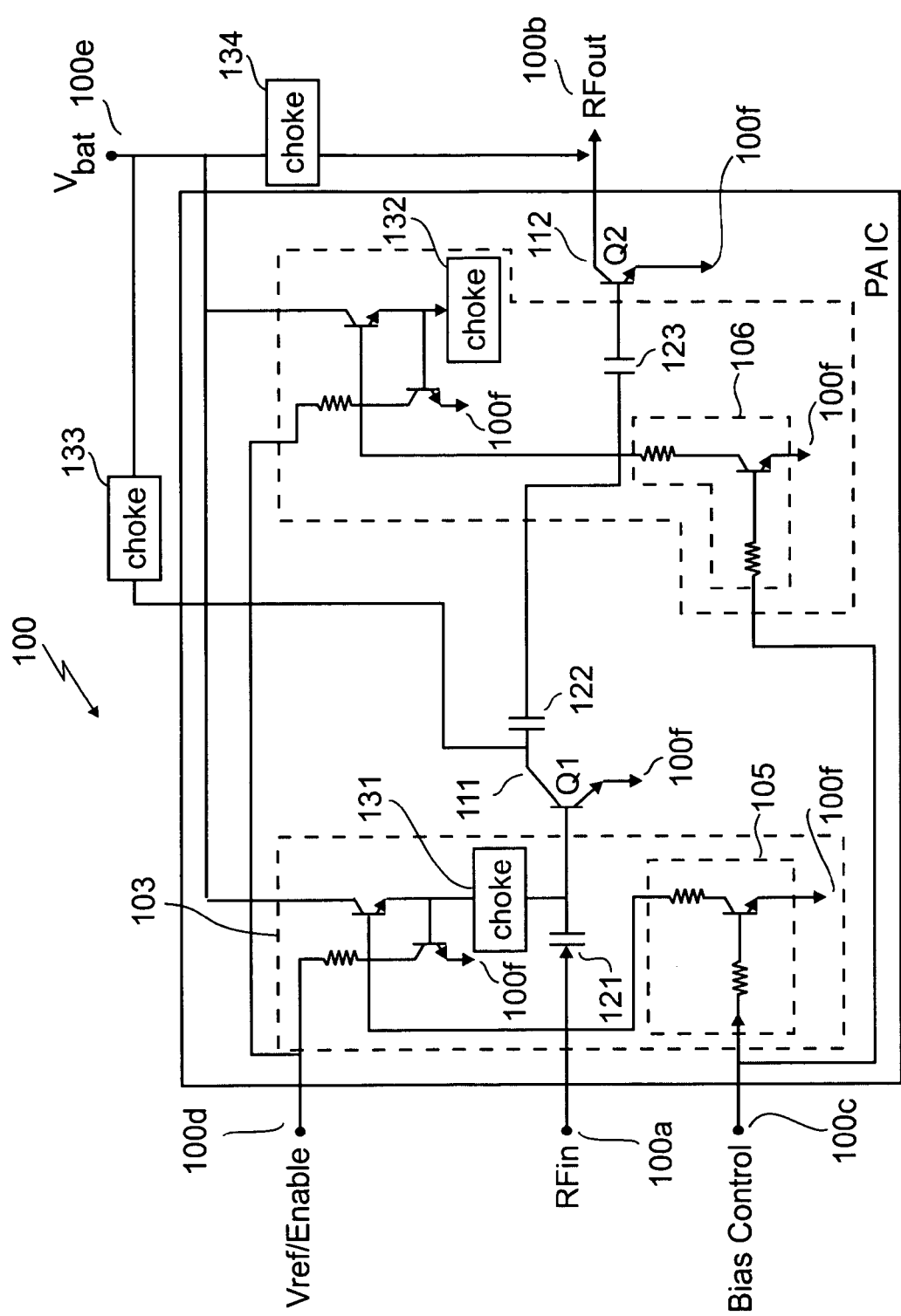
FIG. 1 illustrates a prior art dual stage power amplifier circuit that utilizes digital control of a bias level for each of the stages.

FIG. 1 illustrates a prior art implementation of a two-stage power amplifier integrated circuit (PAIC) 100. The two-stage amplifier circuit is comprised of a first stage that includes a first transistor (Q1) 111 and a second amplification stage that includes a second transistor (Q2) 112. Transistors Q1 111 and Q2 are capacitively coupled to each other using capacitors 122 and 123, which are disposed in series between the collector terminal of Q1 111 and the base terminal of Q2 112. An RF input signal is provided to the PAIC 100 through an input port 100a that is capacitively coupled to Q1 111 using capacitor 121. An output port 100b is formed at the collector terminal of Q2 112. First and second supply voltage input ports, 100e and 100f, are used to supply positive and negative voltages from a voltage supply source, such as a battery to the PAIC 100. A choke 133 is disposed between the first supply voltage input port 100e and the collector terminal of transistor Q1 111 and a choke 134 is disposed between the first supply voltage input port 100e and the collector terminal of transistor Q2 112.

First and second bias voltage sources, 103 and 104, are coupled to the base terminals of transistors Q1 111 and Q2 112, respectively, for controlling of the base terminal voltage of these transistors. Each voltage source, 103 and 104, is provided with an enable port or optionally a voltage reference port 100d and a bias control port 100c.

The bias control port 100c is coupled with a first shunting circuit 105 and with a second shunting circuit 106. The first shunting circuit 105 is coupled to the base terminal of transistor Q1 111 for altering a base terminal bias for transistor Q1 111 in response to a bias signal that is applied to the bias control port 100c. The second shunting circuit 105 is coupled to the base terminal of transistor Q2 112 for altering a base terminal bias for transistor Q2 111 in response to the bias signal that is applied to the bias control port 100c.

The bias signal is either a digital or analog signal, if it is a digital signal it provides digital control of RF signal propagation from the RF input port 100a to the RF output port 100b, thus forming a digitally switched path.

Typically, it is a characteristic of RF transistors, Q1 111 and Q2 112, when used with complex modulation schemes, that for increased bias currents, linearity is maintained at increasingly higher RF output signal power levels. Conversely, for bias currents that are too low, RF output signal linearity suffers with increasing RF input signal power.

Figure 2:
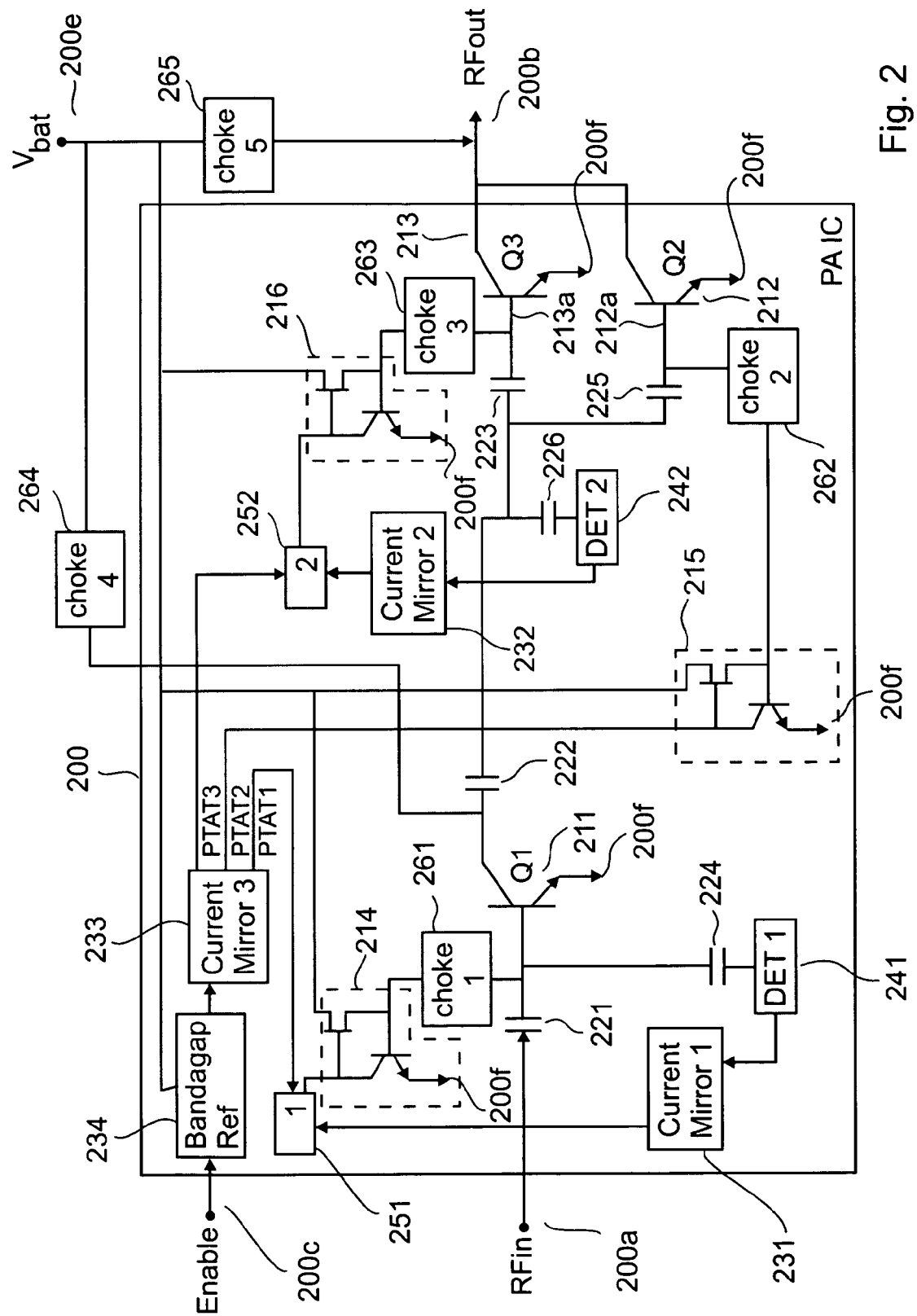
FIG. 2 illustrates an embodiment of the invention, which is a dual stage power amplifier (PA) that utilizes dual power detector feedback for biasing of the first and second stages; and, FIG. 3 summarizes operating steps of the PA in accordance with the embodiment of the invention.

FIG. 2 illustrates a two-stage power amplifier integrated circuit (PAIC) 200 in accordance with an embodiment of the invention. An input stage of the two-stage amplifier circuit is comprised of a first transistor (Q1) 211. An output amplification stage of the two-stage amplifier having an output stage gain is comprised of a first amplifying portion having a first gain portion and including a third transistor (Q3) 213 and a second amplifying portion having a second gain portion and including a second transistor Q2 212 disposed in parallel with the first amplifying portion.

The first gain portion and the second gain portion together form the output stage gain. Transistors Q1 211 and Q3 213 are capacitively coupled to each other using capacitors 222 and 223 disposed in series between the collector terminal of Q1 211 and the base terminal of Q3 213. The base terminal of transistor Q2 212 is capacitively coupled to the base terminal of transistor Q3 213 using capacitors 223 and 225 disposed in series between the base terminals of these transistors. The base terminal of transistor Q3 213 forms a first capacitively coupled input port 213a to the first amplifying portion and the base terminal of transistor Q2 212 forms a second capacitively coupled input port 212a to the second amplifying portion. Collector terminals of transistors Q2 212 and Q3 213 are directly coupled together and form an output port 200b of the PAIC 200.

A RF input signal is provided to the PAIC 200 using an input port 200a that is capacitively coupled to transistor Q1 211 using capacitor 221. First and second supply voltage input ports, 200e and 200f, are used to supply positive and negative voltages from a voltage supply source, such as a battery to the PAIC 200, where the input amplification stage and the output amplification stage are disposed between these supply voltage input ports, 200e and 200f. A first supply voltage input port 200e is coupled with the collector terminal of transistor Q1 211 using a choke 264. Collector terminals of transistors Q2 212 and Q3 213 are coupled together, with both these terminals coupled with a choke 265 to the first supply voltage input port 200e.

A bandgap current reference source 234 is disposed within the PAIC 200 and is provided with an enable port 200c for enabling and disabling the operation thereof. A third current mirror 233 is coupled with the bandgap current reference source 234 for receiving of a reference current therefrom and for providing three proportional to absolute temperature (PTAT) currents, Ibq_01, Ibq_02 and Ibq_03 from three output ports thereof, labeled PTAT1, PTAT2 and PTAT3.

Transistor Q1 211 is biased through a summation of two bias currents. An output port of a first summing circuit 251 is coupled using a first biasing circuit 214 disposed in series with a first choke 261 with an output port of the first choke 261 coupled to the base terminal of transistor Q1 211. The first current for summing, Ibq_01, is provided to the first summing circuit 251 from the third current mirror 233. A first RF power detector 251 is also capacitively coupled, using capacitor 224, to the base terminal of transistor Q1 211. A first current mirror 231 is coupled with the first RF power detector 251 for receiving of a first detected RF signal therefrom. The first current mirror 231 mirrors this first detected RF signal and provides a second current for summing, Ibrf_1, to an input port of the first summing circuit 251.

The second current for summing, Ibrf_1, is added to the first current for summing, Ibq_01, to yield a current that increases with increasing RF power as detected by the first RF power detector 241. Summation of these two currents provides a first summed current that is provided from the output port of the first summing circuit 251 to the first biasing circuit 214 for biasing of the base terminal of transistor Q1 211. The summation of these currents is performed because of the nearly equivalent output port impedances of the current mirror circuits, 231 and 233.

Transistor Q1 211 is provided with an instantaneous collector bias current that increases from a starting current, termed Icq0_1, to a final current, termed Icrf_1, as a result of the summation of a static and dynamic input currents, which are provided from the third current mirror 233 and the first current mirror 231, respectively.

Current provided from the collector terminal of transistor Q1 211, Icrf_1, is not measured within the PAIC 200. However, once the RF input signal is removed from the PAIC 200, Icrf_1 immediately degenerates to Icq0_1. Instead, only Ic_RF is measured, which is an RF signal induced loadline current at any of the collector terminals of the transistors, Q1 211, Q2 212 and Q3 213.

In use of the PAIC 200, transistor Q2 212 operates in a different manner than transistor Q1 211. Transistor Q2 212 utilizes only a single temperature compensated input current Ibq_02, which is converted to voltage using a second biasing circuit 215. The second biasing circuit 215 and a choke 262 are disposed in series between the third current mirror 233 and the base terminal of transistor Q2 212, where the second biasing circuit 215 receives the temperature compensated input current Ibq_02 from the third current mirror 233. Preferably, transistor Q2 212 is set to a higher relative bias condition than transistor Q1 211. This higher relative bias is used to minimize gain expansion that occurs in transistor Q2 212 during operation of the PAIC 200.

Referring to transistor Q3 213, transistors Q3 213 is biased through a summation of two currents. An output port of a second summing circuit 252 is coupled using a second biasing circuit 216 disposed in series with a third choke 263 with an output port of the third choke 263 coupled to the base terminal of transistor Q3 213. The third current Ibq_03 is provided to the second summing circuit 252 from the third current mirror 233. A second RF power detector 242 is also capacitively coupled, using capacitor 226, to a junction formed between capacitors 222 and 223, disposed in series between transistors Q1 211 and Q3 213. A second current mirror 232 is coupled with the second RF power detector 252 for receiving of a second detected signal therefrom. The second current mirror 232 mirrors this current and provides Ibrf_3 to an input port of the second summing circuit 252.

This first current, from the two currents provided to the second summing circuit 252, is a temperature compensated current. The second current, Ibrf_3, from the two currents provided to the second summing circuit 252, is a current that increases with increasing RF signal power provided to the output amplification stage power as detected by the second RF power detector 242. Summation of these two currents is performed because of the nearly equivalent impedances of the current mirror circuits, 233 and 232, which provide the summation of these two currents to the base terminal of transistor Q3 213. In addition, a choke 265 is disposed between the first supply voltage port 200e and the collector terminals of transistors Q3 213 and Q2 212.

The second RF power detector 242 is similar to that used for transistor Q1 221, but with a different, output voltage (Vout) vs RF input power (Pin) slope. Preferably this slope is steeper for the second RF power detector 242 than for the first RF power detector 241. This slope difference results in transistor Q3 213 to operate through a much greater variation in relative bias currents than transistor Q1 211 as RF input power increases from minimum to maximum power levels.

Preferably, transistor Q2 212 is approximately of a same size as transistor Q1 211, but is optionally in the range of $\frac{1}{4}^{th}$ to $\frac{5}{4}^{ths}$ of the size of transistor Q1 211. This active area is dependent upon specific PAIC 200 applications and RF output signal power levels. In addition, transistor Q2 212 is approximately $\frac{1}{8}^{th}$ of the active area of transistor Q3 113, of course this active area depends upon on power requirements for the PAIC 200.

Figure 3:
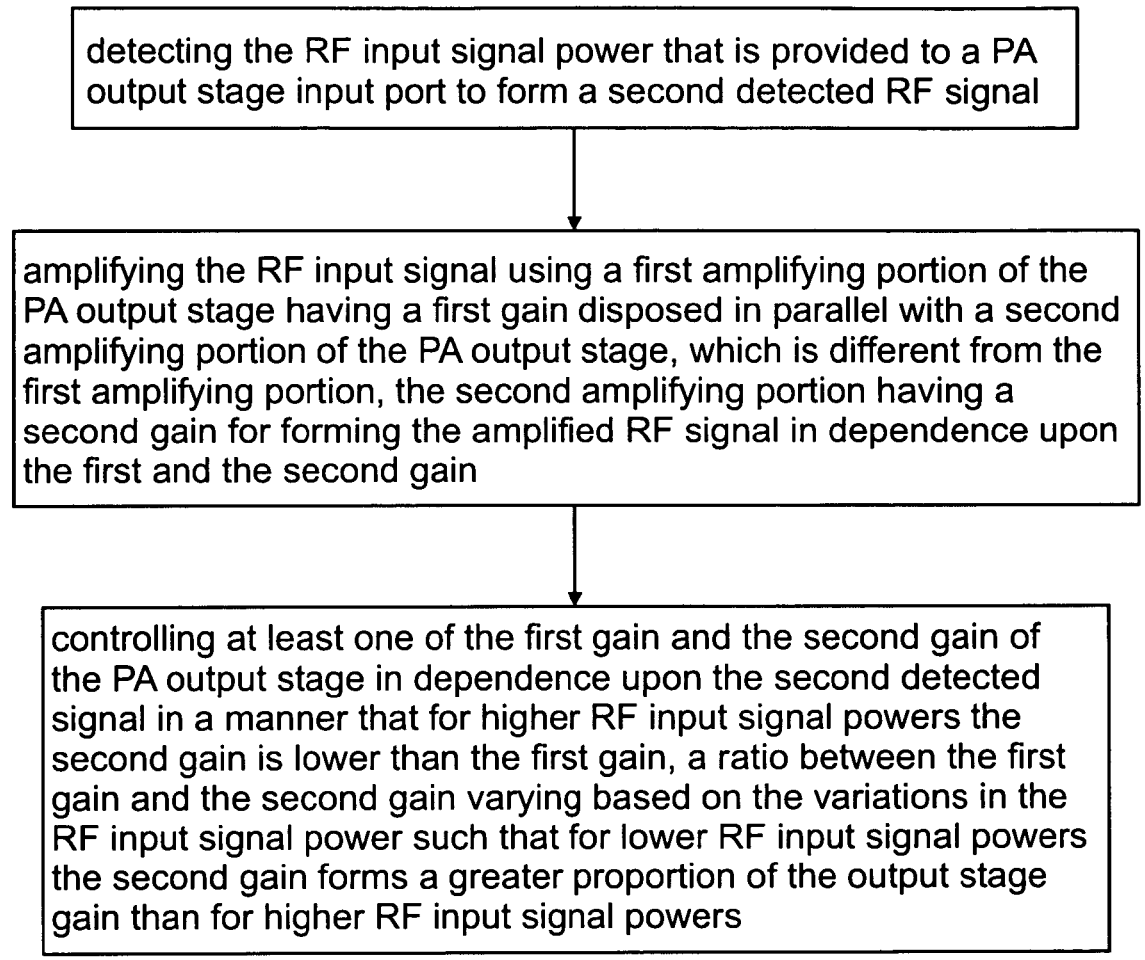

Referring to FIG. 3, operation of the embodiment of the invention shown in FIG. 2 is summarized. Detecting of the RF input signal power that is provided to a PA output stage input port to form a second detected signal is performed. Thereafter, amplifying the RF input signal using the first amplifying portion of the PA and the second amplifying portion of the PA is performed. The RF signal is thus amplified in dependence upon the first and the second gain. During amplification, controlling at least one of the first gain portion and the second gain portion of the PA output stage in performed in dependence upon the second detected signal in a manner that for higher RF input signal powers, the second gain portion is lower than the first gain portion and a ratio between the first gain portion and the second gain portion varies based on the variations in the RF input signal power such that for lower RF input signal powers the second gain portion forms a greater proportion of the output stage gain than for higher RF input signal powers.

Referring back to FIG. 2, biasing currents for biasing of transistors Q1 211 and Q3 213 increase in proportion to their respective increase in detected RF signal power and decrease in a similar manner with reduced RF input signal power. Amplitudes of the currents provided by the current mirrors 231 and 232 are adjustable in order to ensure that a bias point of each transistor increases sufficiently in order to provide appropriate RF output signal linearity within predetermined specifications for modulated signals of varying peak to average ratios. Since transistor Q2 212 has a higher relative bias point, its gain is nearly constant throughout its operation within the RF input signal operating range from minimum to maximum power levels of the RF input signal. Thus, transistor Q2 212 exhibits a dominant gain behavior with respect to transistor Q3 213, permitting more predictable calibration with fewer calibration points for the RF path between the input port 200a and the output port 200b. External biasing of the PAIC 200 is not performed because the circuit design provides a minimum current at a specific incident RF power level for the input signal and increases the biasing current that is provided to transistors Q1 211, Q2 212 and Q3 213 as RF input power increases.

Advantageously, current in the circuit is automatically and continuously monitored and controlled to follow the RF input signal power and not the modulation envelope. Thus, a single quiescent state "Icq0" exists rather than two quiescent states as are found in PAs that operate using switching of bias voltages in a binary manner. In this embodiment of the invention, a final quiescent target, Icq_f, is supported as a virtual bias state. Further advantageously, precise and independent control of each stage, either the input stage or the output stage, is achieved with dedicated first and second RF power detectors. Hysteresis loops are not employed within the PAIC 200 since the gain and phase of the output signal exhibits monotonic, or analog, behaviors. This monotonic behavior is an important attribute for most baseband processors in modern transceiver chains.

The embodiment of the invention provides a multi-stage PAIC 200 with incorporated biasing circuitry. Of course, the PAIC 200 in accordance with the embodiment of the invention is not limited to multi-stage but is also applicable to a single stage design. The PAIC 200 provides an improvement over the prior art by separating the output stage of the PAIC 200 into multiple (N) sections that are capacitively coupled together but are biased separately using dedicated biasing circuits. In addition, each stage of the PAIC 200 is provided with a dedicated, capacitively coupled, RF power detector that generates a voltage proportional to an average RF power incident at each detector input port. Each detector is designed in such a manner as to be non-responsive to the frequency of the applied modulation. The detectors utilize a voltage to current translation circuit, which creates a current proportional to the detector's output voltage. In addition, a slope and gain adjustment circuit is optionally provided to control output signal characteristics of the detectors.

Advantageously, the embodiment of the invention provide a circuit for automatic control of quiescent current in RF power amplifiers operating with or without complex modulated input signals for a range of operating classes, including, but not limited to class A, AB, and C operation. The embodiment herein described ideally permits minimum current consumption over a wide range of operating conditions while eliminating a need for external control signals. Further advantageously, the embodiment of the invention is implemented on a single silicon die—effectively combining the automatic biasing stages with the power amplifier stages, thus forming the PAIC.

Numerous other embodiments may be envisaged without departing from the spirit or scope of the invention.

What is claimed is:

1. A power amplifier (PA) comprising:
   a PA output stage having a first amplifying portion having a first gain portion and disposed in parallel with a second amplifying portion having a second gain portion, the PA output stage having an output stage input port for receiving of a RF input signal, an output stage output port for providing of an amplified RF signal, and an output stage gain being the gain from the output stage input port to the output stage output port;
   a second RF power detector for detecting a signal power of the RF input signal and for providing a second detected signal based on the detected signal power; and,
   at least a biasing circuit for biasing the first amplifying portion and the second amplifying portion in dependence upon the second detected signal for amplifying the RF input signal such that for a same output stage gain the ratio between the first gain portion and the second gain portion varies in dependence upon the second detected signal.

2. A PA according to claim 1, wherein the at least a biasing circuit comprises:
   a first biasing circuit for biasing of the first amplifying portion; and
   a second biasing circuit different from the first biasing circuit for biasing of the second amplifying portion.

3. A PA according to claim 1, comprising:
   a first capacitive coupling between the output stage input port and a first capacitively coupled input port of the first amplifying portion; and
   a second capacitive coupling between the output stage input port and a second capacitively coupled input port of the second amplifying portion.

4. A power amplifier circuit according to claim 1, comprising:
   an input amplification stage having an input gain and an input port for receiving of the RF input signal and an output port for providing of the amplified version of the RF input signal to the input port of the output amplification stage, the input amplification stage comprising:
   a first amplification stage; and
   a first RF power detector circuit coupled with the input port of the input amplification stage for detecting a signal power of the RF input signal to form a first detected RF signal.

5. A power amplifier circuit according to claim 4, wherein the first amplification stage comprises a first transistor, the second amplification stage comprises a second transistor and the third amplification stage comprises a third transistor, wherein the second transistor is in the range of $1/4^{th}$ to $5/4^{th}$ of the size of the first transistor and the second transistor is approximately $1/8^{th}$ the size of the third transistor.

6. A PA according to claim 1, wherein the at least a biasing circuit is for simultaneously biasing each of the first amplifying portion and the second amplifying portion and is other than a switching circuit for switching therebetween.

7. A PA according to claim 1, wherein the second amplifying portion comprises a smaller active area for amplification than an active area of the first amplifying portion.

8. A method of controlling of quiescent current for a radio frequency (RF) power amplifier (PA) circuit comprising:
   providing a PA output stage having an output stage gain, an input port and an output port for providing an amplified RF signal therefrom;
   providing of a RF input signal having a RF input signal power and a modulation frequency to the PA output stage input port;
   detecting the RF input signal power that is provided to the PA output stage input port to form a second detected signal;
   amplifying the RF input signal using a first amplifying portion of the PA output stage having a first gain portion disposed in parallel with a second amplifying portion of the PA output stage, which is different from the first amplifying portion, the second amplifying portion having a second gain portion for forming the amplified RF signal in dependence upon the first and the second gain portions; and,
   controlling at least one of the first gain portion and the second gain portion of the PA output stage in dependence upon the second detected signal in a manner that for higher RF input signal powers the second gain portion is lower than the first gain portion, a ratio between the first gain portion and the second gain portion varying based on the variations in the RF input signal power such that for lower RF input signal powers the second gain portion forms a greater proportion of the output stage gain than for higher RF input signal powers.

9. A method according to claim 8, wherein controlling comprises other than performing a switching operation between use of the first amplifying portion and the second amplifying portion in amplifying of the RF input signal.

10. A method according to claim 8, comprising providing a RF power detector for detecting the RF input signal power, wherein the detector is non-responsive to the modulation frequency of the RF input signal.

11. A method according to claim 9, comprising increasing bias currents provided to one of the first amplifying portion and to the second amplifying portion in dependence upon the detected RF input signal power.

12. A method according to claim 8, wherein the second gain portion is substantially constant during operation of the PA circuit.

13. A method according to claim 8, comprising:
providing of a reference current; and
varying at least one of the first gain portion and the second gain portion in dependence upon the reference current.

14. A method according to claim 13, where varying comprises summing of the reference current and the second detected signal for varying at least one of the first gain portion and the second gain portion.

15. A method according to claim 8, comprising other than externally controlling the first and second gain portions using external control signals during amplifying the RF input signal using the first amplifying portion and the second amplifying portion.

16. A power amplifier circuit comprising:
an output amplification stage for receiving one of the RF input signal having a modulation frequency and an amplified version of the RF input signal having a modulation frequency and for providing the amplified RF signal from an output port thereof with the amplified RF signal based upon the RF input signal, the output amplification stage comprising:
a second amplification stage;
a third amplification stage capacitively coupled with the second amplification stage, the second and third amplification stages having input ports thereof coupled together and output ports thereof coupled together;
a second RF power detector circuit coupled with the output amplification stage for detecting a signal power of one of the RF input signal and the amplified version of the RF input signal and for generating a second detected signal;
a second biasing circuit for biasing of the second amplification stage independently of the second detected signal; and,
a third biasing circuit, different from the second biasing circuit, for biasing of the third amplification stage and for adjusting the third gain at least partially in dependence upon the second detected signal.

17. A power amplifier circuit according to claim 16, wherein the second RF power detector circuit is non responsive to the modulation frequency of one of the RF input signal and an amplified version of the RF input signal.

18. A power amplifier circuit according to claim 16, wherein the second amplification stage comprises a second transistor and the third amplification stage comprises a third transistor wherein the second transistor is biased at a higher bias point than the third transistor by the second and third biasing circuits, respectively.

19. A power amplifier circuit according to claim 16, comprising a bandgap current reference source for providing a reference current from an output port thereof.

20. A power amplifier circuit according to claim 19, wherein the reference current source comprises temperature compensation circuitry for providing the reference current that is temperature compensated.

21. A power amplifier circuit according to claim 19, wherein the reference current is a fixed reference current source comprising a plurality of output ports.

22. A power amplifier circuit according to claim 19, comprising: a third current mirror coupled with the fixed reference current source for receiving of the reference current and for mirroring this current to provide a third reference current.

23. A power amplifier circuit according to claim 22, comprising: a second summing circuit coupled with the third current mirror for receiving of the third reference current and for providing a second summed current at least partially dependent upon the third reference current.

24. A power amplifier circuit according to claim 23, comprising a second summing circuit coupled with the second RF power detector for receiving of a second detected signal and for summing this signal with the third reference current for varying the output gain.

25. A power amplifier circuit according to claim 16, comprising:
an input amplification stage having an input gain and an input port for receiving of the RF input signal and an output port for providing of the amplified version of the RF input signal to the output amplification stage, the input amplification stage comprising:
a first amplification stage; and
a first RF power detector circuit coupled with the input port of the input amplification stage for detecting a signal power of the RF input signal to form a first detected RF signal.

26. A power amplifier circuit according to claim 25, comprising: a first summing circuit coupled with the third current mirror for receiving of the first reference current and for receiving of the first detected RF signal and for providing a first summed current dependent upon the first reference current and the first detected RF signal.

27. A power amplifier circuit according to claim 25, comprising: a first biasing circuit for biasing of the input amplification stage and for adjusting the input gain of the input amplification stage in dependence upon the first summed current.

* * * * *